United States Patent [19]
Wolber et al.

[11] Patent Number: 5,872,367
[45] Date of Patent: Feb. 16, 1999

[54] HIGH PRECISION MOUNT

[75] Inventors: John W. Wolber, New Hampshire; Robert L. Montbleau, Dracut, both of Mass.

[73] Assignee: Misomex International Corporation, Hudson, N.H.

[21] Appl. No.: 831,825

[22] Filed: Apr. 2, 1997

[51] Int. Cl.⁶ ........................................................ B41J 2/47
[52] U.S. Cl. ...................... 250/522.1; 347/238; 347/242; 347/245; 347/257
[58] Field of Search .............................. 250/522.1, 492.3; 347/238, 242, 245, 257

[56] References Cited

U.S. PATENT DOCUMENTS

| | | | |
|---|---|---|---|
| 4,543,615 | 9/1985 | Van Campenout et al. | 358/285 |
| 4,991,962 | 2/1991 | Jain | 356/349 |
| 5,432,535 | 7/1995 | Andrews er al. | 347/242 |
| 5,453,814 | 9/1995 | Aiyer | 355/70 |
| 5,471,236 | 11/1995 | Ito | 347/233 |
| 5,479,201 | 12/1995 | Sugiura et al. | 347/242 |
| 5,521,629 | 5/1996 | Deboer et al. | 347/262 |
| 5,543,269 | 8/1996 | Chatterjee et al. | 430/346 |
| 5,566,277 | 10/1996 | Hideshima et al. | 395/115 |
| 5,717,451 | 2/1998 | Katano et al. | 347/242 |

*Primary Examiner*—Jack I. Berman
*Attorney, Agent, or Firm*—Scott B. Garrison; Lambert & Garrison PLLC

[57] ABSTRACT

A stable mount for mounting a narrow bandwidth beam generating source such as a laser or electron beam. The mount places two such devices in substantially vertical alignment with each other. One of the sources is completely adjustable with respect to the other. The device is especially suitable for the imaging field where it is desired to couple two laser heads each having one or a multiple of individual laser beams. The laser heads formerly subjected to mechanical vibration and temperature induced drift, can now be precisely located, adjusted and stabilized one to the next. This allows for increased job throughput without sacrificing the fidelity or macroscopic quality of the resulting image. The device is also suitable for use in photo microlithography where precise alignment is critical.

22 Claims, 5 Drawing Sheets

HIGH PRECISION MOUNT

BACKGROUND OF THE INVENTION

This invention relates to a method and apparatus for providing an ultrastable and readily adjustable mounting device. More particularly it relates to a mounting apparatus having a particular applicability to mounting two separate and distinct laser emitting devices, electron beam devices, or other extreme precision devices in ultrastable yet readily adjustable relation to one another.

A primary objective of the imaging industry in general is to create images containing a minimum of macroscopic image artifacts or defects. Fidelity of the image is critical to the quality of the graphic art job. Minor deviations in the image can be magnified greatly through the frequency in which they occur. Although these deviations can be in the neighborhood of 1–2 microns, the repetition of a number of these deviations manifests itself as banding of the image or some other visible defect in the finished product. Additionally, the goal of photo microlithography is to create images of the finest detail possible. High resolution images having extremely narrow line and space widths permit the manufacture of both integrated circuitry and electronic circuit boards. As such photoimaging is extensively used in areas where alignment precision within an accuracy of 0.2–0.3 micron is not unheard of.

Although the degree of precision may vary pursuant to the specific industry, the imaging industry in general utilize systems which typically include: an exposure source such as a high intensity lamp, electron beam, laser, or source of other radiation; mask and substrate positioning systems; a projection system to illuminate and image the pattern present on the mask onto a substrate; and an alignment system to accurately position the mask with the substrate prior to exposure. The illumination process is used to either: (1) illuminate portions of the substrate thus exposing these portions; or (2) ablate a coating from regions of the substrate. After one of these or a similar process, the substrate may later undergo further processing or treatment to render the finished product.

Lasers, possessing the requisite degree of precision, are ideal for graphic arts as well as photo microlithography. Over the years the lasers used in such devices have progressed from single beam lasers to multi-beam lasers. Continuous advances in laser technology have enabled ever greater numbers of laser light beams to be coupled into each individual laser head.

Typically, in a multi-beam laser head, each laser beam is located a fixed distance $r_h$ from its neighboring laser beam. To provide adjustability in the placement of each laser beam onto the substrate medium, the entire head is usually capable of rotation. Rotation has the effect of enabling the horizontal distance $r_x$ to vary between $r_{min}$ and $r_{max}$ which can range from 0 to $r_r$. However, any decrease in the horizontal distance $r_x$ necessarily results in a corresponding increase in vertical distance $r_y$ between each laser beam. The effect is governed by the following simple equation:

$$r_x = (r_h^2 + r_y^2)^{1/2} \qquad (1)$$

For example, in some films or plates used in the context of graphic artwork, one possible laser imager design utilizes a cylindrical drum covered with either a photo-sensitive substrate or a substrate with an ablative coating which is rotated at a fixed velocity about its central axis. A laser beam or a number of laser beams are mounted to a carriage assembly which is located at the perimeter of the cylindrical drum and caused to move along the length of the cylindrical drum. In the event a plurality of laser beams are utilized, they are located within a single laser head. Each laser beam is the fixed distance $r_h$ from its neighboring laser beam. By rotating the laser head about its central axis, $r_x$ is reduced from its original dimension of $r_h$ to some desired value. Although vertical displacement of each laser beam is now greater, a computer is used to delay the pulse of each laser beam by a formula which takes into account the velocity of the drum at the drum's surface, the vertical distance $r_y$ between each laser beam, and the distance of each laser from the drum's surface. A carriage upon which the laser head may be mounted is made to move along the length of the drum and adjacent to its surface. The result of sequencing each laser beam pulse while the carriage moves along the drum provides the capability to reproduce any image by a series of microscopic dots. Proper sequencing of each laser beam pulse can provide images with extremely high resolutions and no visible defect or artifacts. In order to maintain the degree of fidelity required in an image, each element in the machine must be precise in its operation. This means that the laser head must be dimensionally stable, the drum must rotate at a velocity precisely correlated to the computer algorithm controlling each individual laser beam pulse, the carriage must move smoothly and the substrate must be accurately positioned on the rotating drum.

Solutions are known in the art to enable such a system to operate adequately. However, at the present time, the maximum number of laser beams which can be used upon devices of this nature are limited by the number of laser beams a manufacturer places into a laser beam head.

To increase production, the Applicants have desired to increase the number of laser beams capable of being used in the generation of a graphic image beyond that currently manufactured in a single head. Since the need to accurately control the placement of each laser beam pulse onto the substrate is critical to the image's fidelity, it was considered impossible to couple two laser heads together without significant deterioration to the fidelity as well as to the accuracy and resolution of the exposure on the substrate. Although each laser beam could be accurately adjusted with respect to an adjacent laser beam contained within the same laser beam head as discussed above, two laser heads could not be accurately adjusted with respect to each other. The problem was that the capability to adjust one laser beam head with respect to the other and to enable them to remain in stable relation simply could not be maintained accurately enough to create an image of the requisite quality. Not only did the mount used to support the laser beam head move under thermally induced expansion and contraction, but drift between the two laser beam heads occurred as well. Any movement between the two translated to a significant alteration in the dimensions $r_x$ and $r_y$ between any two or more laser beams. Though the displacement between each laser beam head appeared minor, the continuous propagation of the error manifests itself macroscopically as banding or some other deterioration in the fidelity ol the image. Furthermore mechanical vibration and drift in placement of the two laser beam heads compound the problem so that it was heretofore unfeasible to couple two laser heads together.

SUMMARY OF THE INVENTION

A primary object of the present invention is to provide a stable mount capable of accurately aligning and supporting two laser heads so that each laser beam can be maintained a fixed distance from the next even between separate laser heads.

Another object of the present invention is to provide a laser mount which itself provides all of the necessary adjustabilty to precisely align one laser head with another.

Yet another object of the present invention is to provide an improved laser mount capable of precise and stable adjustment between laser beams with minimal impact resulting from thermal expansion and contraction of the laser mount.

Still another object of the present invention is to provide a means of stabilizing at least one high intensity lamp, laser or source of other radiation with respect to another.

Another object of the present invention is to provide a stable mount capable of precise and long-term alignment of more than one laser, electron beam, or other narrow bandwidth emission for use in the imaging industry.

To accomplish these and other objects, according to the invention there is provided a mounting block preferably comprising a material having the properties a low coefficient of thermal expansion and a low degree of mechanical creep. The mounting block receives and retains a laser head having one or any number of individual laser beams therein. To compensate for any degree of thermal expansion or contraction which may exist, the laser heads are mounted onto the mounting block and the mounting block is configured such that, any thermally dependent movement is equally absorbed by both laser heads unitarily. The laser heads can be positionally adjusted with respect to each other by adjustment means which is integrated into the laser mounting block itself. The mounting block is held within a support structure which forms a part of or otherwise moves along with a carriage. The mounting block is pinned to the support structure at a central axis of the mounting block. This serves to further minimize any asymmetrical deflection of the mounting block which may be transferred to the laser beams caused by a temperature induced movement of the support structure.

The advantage of the invention is its ability to provide high positioning accuracy between more than one laser head and to do so completely within the mounting block itself. This enables a greater number of laser beams to be utilized in a process to provide faster results in greater quantities without impact to the quality of the image.

BRIEF DESCRIPTION OF THE DRAWINGS

The novel features considered characteristic of the invention are set forth in the appended claims. The invention itself, however, both as to its construction and its method of operation, together with additional objects, features and advantages thereof, will best be understood from the following description of the specific embodiments when read and understood in connection with the accompanying drawings.

DETAILED DESCRIPTION OF THE PREFERRED EMBODIMENT

Figure 1:
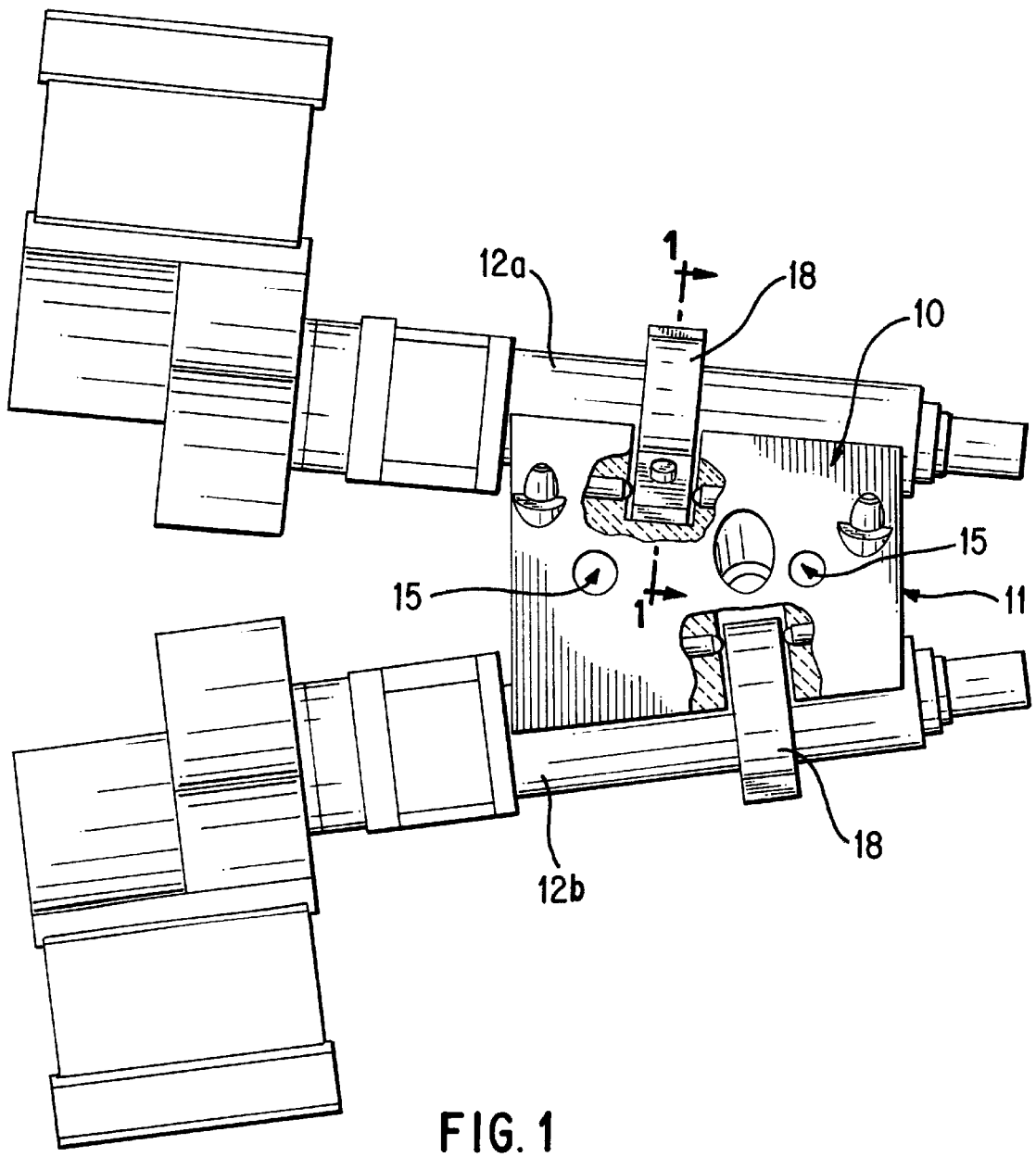
FIG. 1 is a side elevation view of a mounting block adapted to stably retain in adjustable relation a plurality of laser heads, in this case two, according to one preferred embodiment of the present invention, further depicting a cut away section which shows adjustability in a z direction.
Figure 2:
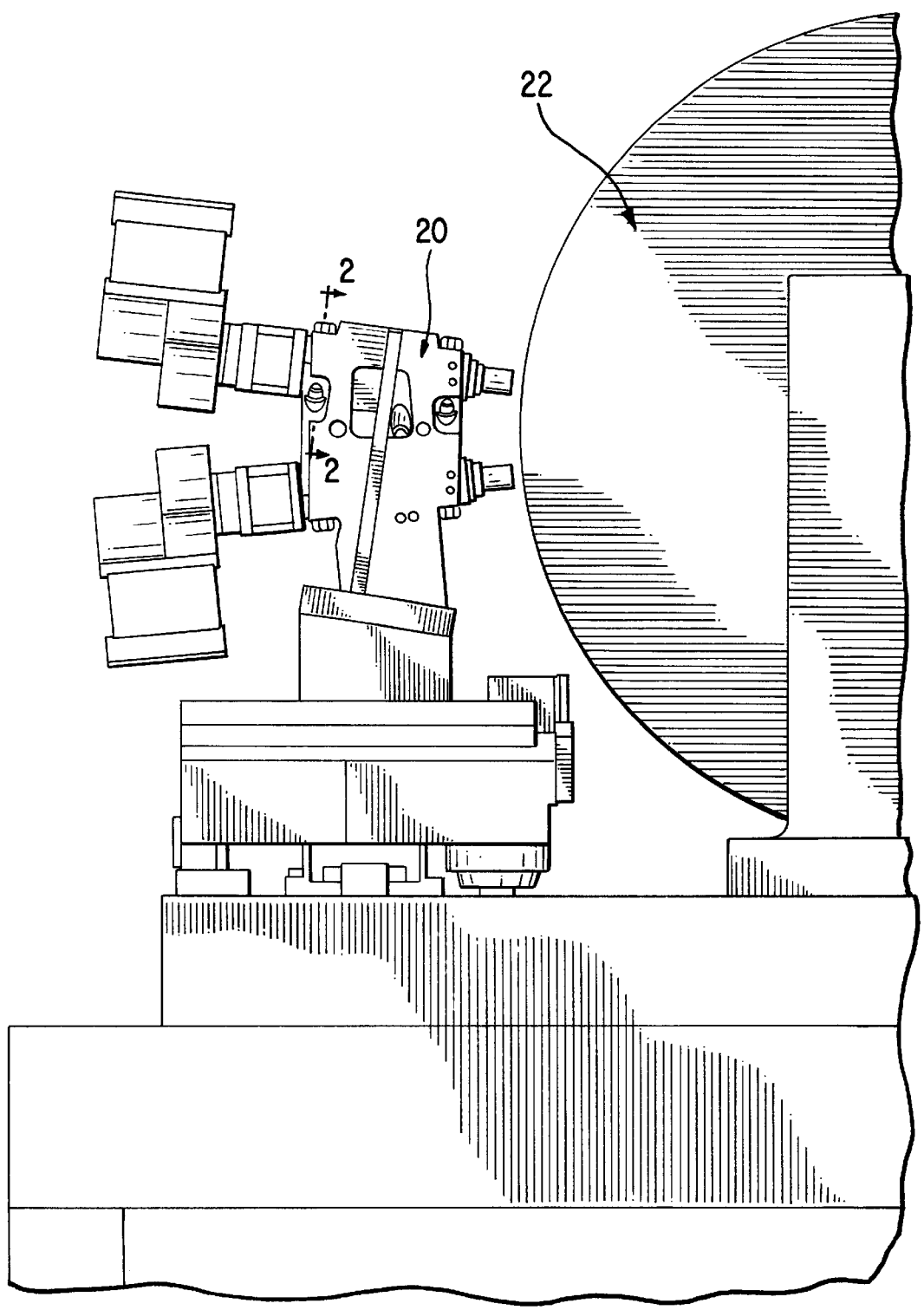
FIG. 2 is a partial side elevation showing one possible imaging mechanism upon which the FIG. 1 device is particularly suited.

Referring to FIGS. 1 and 2, a preferred embodiment of the present invention referred to in its entirety by reference numeral 10 is depicted and is intended for securely and adjustably retaining at least one laser, in this case two. The mounting block 10 is suitably adapted for use in the graphic arts imaging field, specifically where it is desired for more than one laser or other narrow bandwidth emitter or energy source to be maintained at a stable position with respect to another. Generally, the distance between both lasers, in this case, tube type laser heads 12a and 12b is as small as possible. However, due to the nature of many available lasers and laser heads, the lasers cannot always be made to intimately contact each other. To maintain as small a separation as possible at a front face 11 while compensating for the circuitry and casing mounted to a rear end of the tubular laser heads 12a and 12b, the block 10 is tapered. FIG. 2 is a depiction of an imaging device upon which the block could be suitably mounted.

Figure 3:
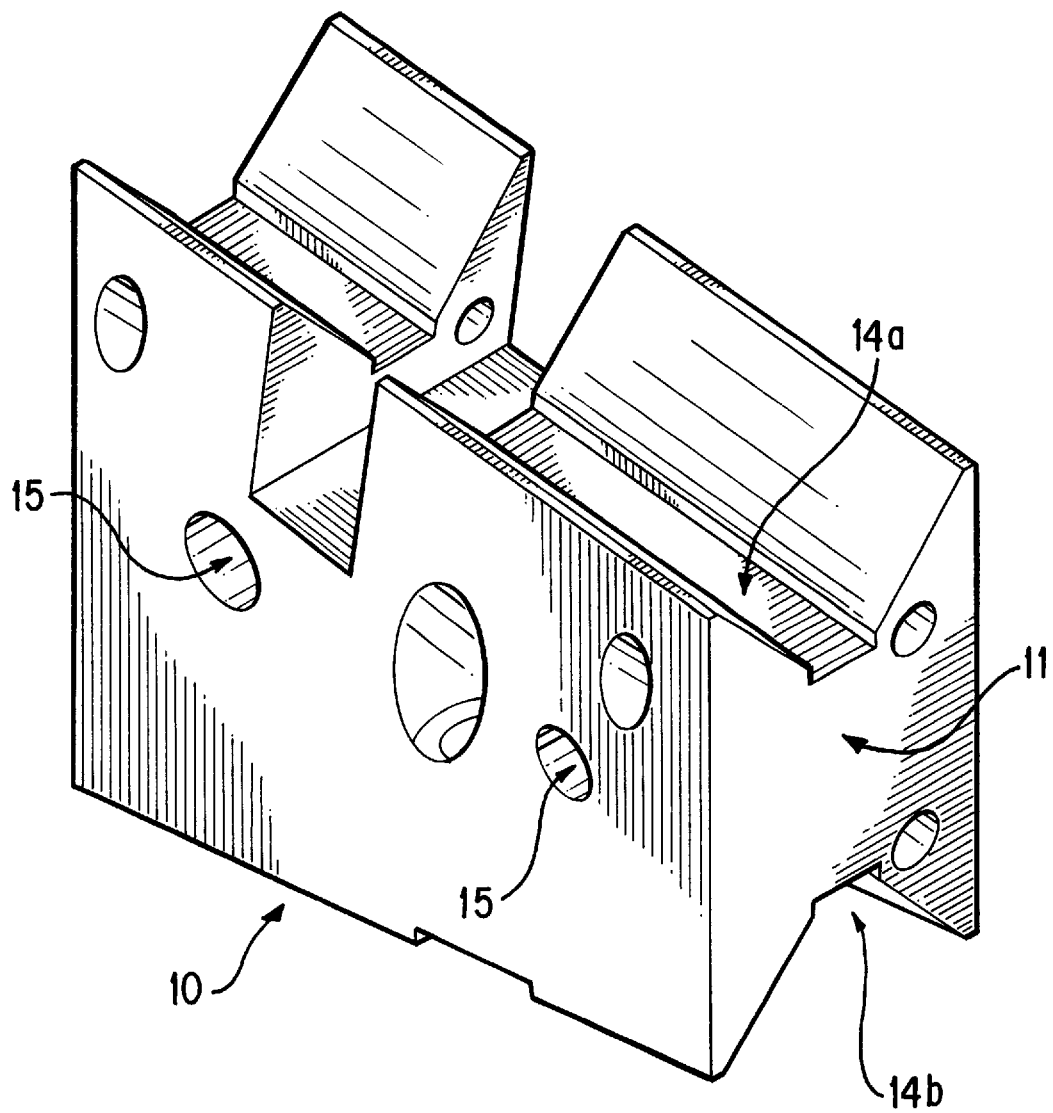
FIG. 3 is an isometric view of the FIG. 1 mounting block alone.

The basic shape of the mounting block 10, exclusive of machined apertures, as can be seen in FIGS. 1 and 3 is as symmetrically mirrored about both its horizontal centerline and its vertical centerline as possible. This is critical to ensure equal movement about each of these centerlines as the block 10 expands and contracts with respect to changes in temperature. As can be seen by looking at both FIGS. 1 and 3, each laser head 12a and 12b is cradled within the mounting block 10 at cradling surfaces 14a and 14b respectively, such that each laser head is substantially vertically aligned to the other. A means for adjustability, discussed later, is capable of vertically offsetting one laser head with respect to the other. The thickness of the mounting block 10 between laser heads 12a and 12b should be as small as possible but still allow for necessary and non-interfering rotation of each laser head upon its cradling surface.

Figure 4:
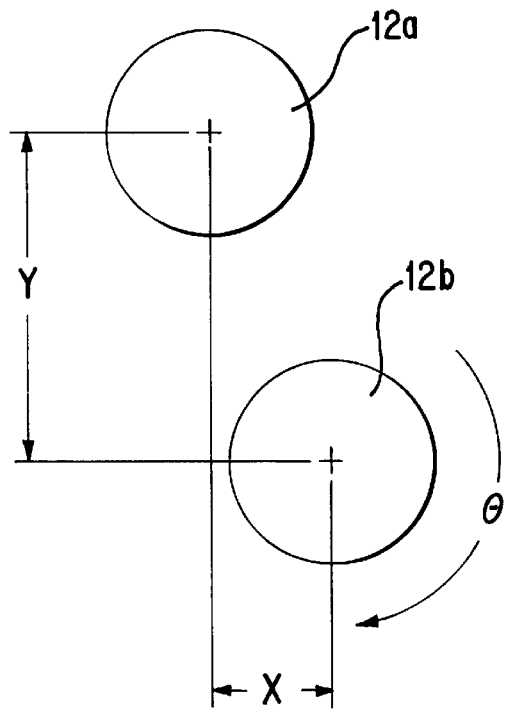
FIG. 4 is an explanatory view of the desired directions of adjustment in laser heads used in the FIG. 1 device.

To minimize the effects of temperature upon the mounting block 10, it is preferred that it manufactured from a material having a low coefficient of thermal expansion. Some such materials Applicants consider to possess the desired characteristics are invar, ceramics, ceramic composites, and material equivalents. The reason for using a material possessing a low coefficient of thermal expansion is as follows; first, a certain thickness of material comprising the block 10 will by necessity remain between each laser head at front face 11 and it is desirable to reduce unintentional displacement of one laser head from the other due to temperature changes, and second, any asymmetrical temperature induced deflections of the block 10 due to minor deviations in symmetry will remain below threshold tolerances. Although a material with a low coefficient of thermal expansion is preferable it is by no means required. The symmetry of the block should eliminate the majority of undesirable temperature dependent movement with the exception of the vertical displacement of one laser head from the other. As discussed in the next paragraph, vertical displacement of the laser head 12a as referenced by a horizontal centerline taken through said laser head from the laser head 12b as referenced by a similar horizontal centerline taken through it, in other words, the displacement along the y axis can be accommodated and subsequently negated by computer algorithm. The problem however is that it continues to remain undesirable for any constantly varying temperature induced movement along the y axis during an operation. This is more apt to occur with materials having a higher coefficient of thermal expansion. As such, invar is known by the Applicants to provide the desirable characteristics of thermal stability as well as minimal mechanical creep Although each laser head will be rigidly secured to the mounting block by a retainer band 13, all necessary adjustability to move one laser head with respect to the other is to be included within the laser block 10. As depicted over FIGS. 1, 4, 6 and 7, adjustability should be provided for in at least three separate directions, the x, z, and θ direction. The direction x signifies the horizontal distance or that horizontal distance separating the vertical centerline of the laser head 12a from the vertical centerline of the laser head 12b as seen on FIG. 4. The direction z, being the distance each tip of the laser head 12a and 12b, respectively, is from the surface of the substrate (not shown), and θ being the rotational position of each laser head, also shown on FIG. 4. Adjustability in the y direction is not considered a necessary adjustment since the desire is to keep the distance between each laser head as small as practical. However, if the application called for it, adjustability in the y direction could also be easily accomplished, since in the preferred embodiment x direction adjustability also affects y displacement between each laser head anyway.

In the preferred embodiment laser head 12a is provided with all three directions of adjustability, whereas laser head 12b is provided with adjustability in the θ direction only,. or alternatively in the θ direction and z direction. The Applicant's consider the best mode to be served by essentially adjusting one laser head to the other which therefore can be made to remain static. However, at a minimum, the static laser head, in this case laser head 12b, must still allow for adjustability in the θ direction. It is also envisioned that focal adjustment of the laser beams emanating from each laser head is a desirable, therefore adjustment of both laser heads in the z direction is contemplated as well.

Figure 5:
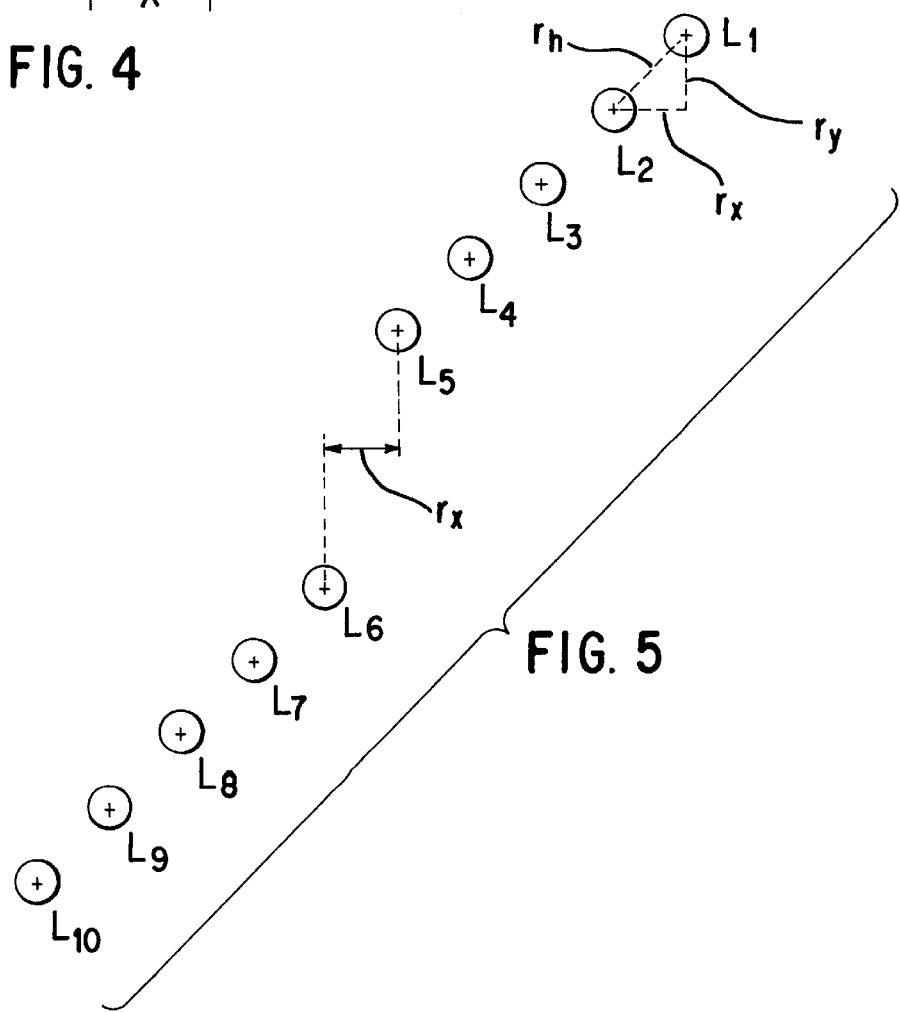
FIG. 5 is explanatory view further depicting the necessary adjustability which must be incorporated into the FIG. 1 device from the perspective of a plurality of individual laser beams.

The overall intent of the invention is to be able to precisely adjust and maintain placement of each laser beam emanating from each laser head within a specific target range. For instance in the graphic arts industry, placement of each laser beam must be commensurate to ensure that the overall fidelity of the macroscopic image is not affected. As shown in FIG. 5, to ensure a proper image, in the illustrated case, the dimension $r_x$ must be the same between each laser beam L, within plus or minus 10 percent regardless of the laser head from which laser beam L emanates. For instance, if the distance $r_h$ were 25 microns, and $r_x$ was adjusted to equal 10 microns between each of $L_1$ to $L_5$ and $L_6$ to $L_{10}$, than the distance $r_x$ between $L_5$ and $L_6$ must be between 9 and 11 microns. To provide for this adjustability a means for independently adjusting each of the provided for directional adjustments of each of the laser heads is needed. Since extremely fine adjustments are necessary, Applicant's consider any device capable of enabling very fine adjustment contained entirely within the mounting block 10 to be suitable. However, Applicant's consider a fine threaded screw to be one means of providing the necessary degree of adjustability. As such, Applicants have utilized easily obtained screws having 80 or 127 threads per inch. Screws having this fine a thread provide an extremely small degree of linear movement for each revolution of the screw. This linear movement is utilized to positionally adjust each laser head as required.

Figure 6:
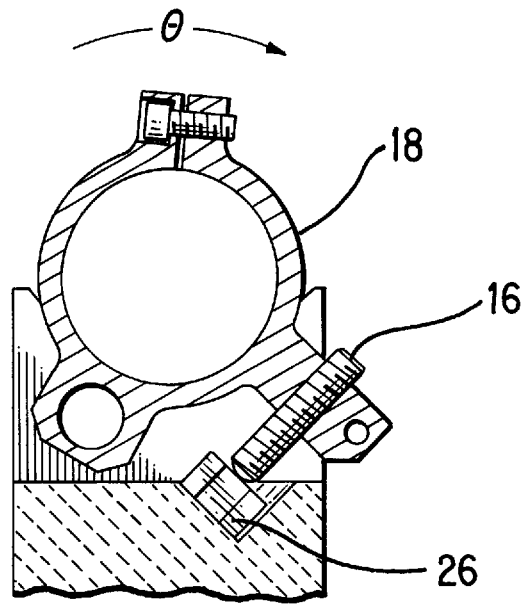
FIG. 6 is a partial sectional view of the FIG. 1 device taken through line 1—1 of FIG. 1 depicting a degree of adjustability, in this case in the θ direction.
Figure 7:
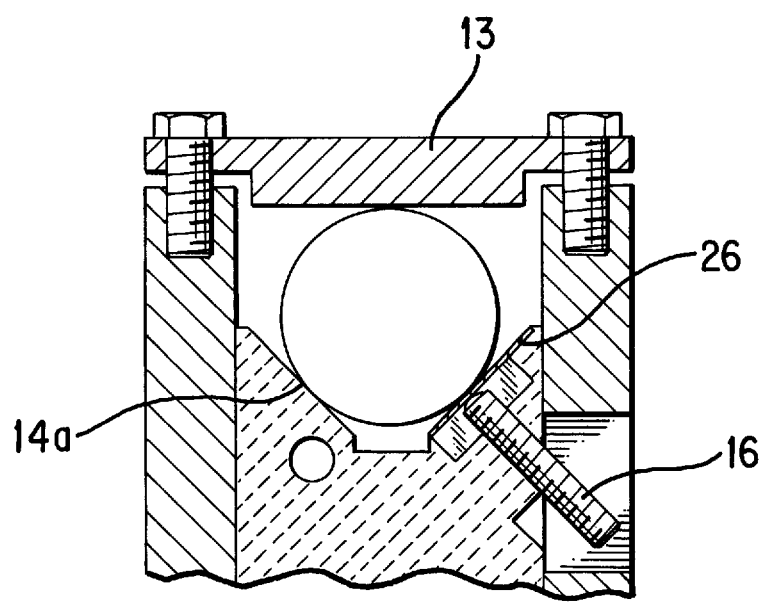
FIG. 7 is a partial sectional view of the FIG. 1 device taken through line 2—2 of FIG. 2 depicting adjustability in the x direction.

Now referring to FIGS. 1, 6 and 7, it is seen that adjusting means comprising fine threaded screws 16 are threadingly engaged at various positions into said mounting block 10 and protrude therethrough to intimately communicate with a hardened surface in communication with each laser head 12a or 12b. For instance, as shown in FIG. 6. one Such adjusting screw 16 engages a collar 18 which is affixed to each of laser heads 12a and 12b. Adjusting screw 16 impinges upon a hardened surface 26 causing the laser head to be rotated about the θ direction. Also seen on FIG. 1 are two additional screws 16 which impinge upon a forward and a rearward surface of said collar 18, by adjusting each, the laser head can be moved back and forth to adjust the focal distance of the laser beams in the z direction. As seen in FIG. 7, an additional screw 16 interacting with a hardened surface 26 is made to cause the laser head to move up one side of the cradling surfaces. This provides adjustability in the x direction. Although it also affects the y direction, as stated, a suitable algorithm exists which can be made to pulse the lasers at a specific time thereby compensating for individual laser displacement in the y direction. Adjustability in the x direction should be accomplished by displacing the laser head along an inclined plane because each cradling surface is configured symmetrically to minimize any effects temperature may have on the movement of the mounting block 10.

Retainer band 13 is used to secure the laser heads 12a and 12b into the mounting block 10. To secure the mounting block and laser assembly to a carriage upon which it can be utilized, a mounting block support structure 20 is provided which is illustrated in FIG. 2. The mounting block support structure 20 should be rigid and symmetrical to minimize any mechanical vibrations or temperature dependent movement to the mounting block 10. Although the mounting block support structure 20 can expand or contract with temperature, by pinning the mounting block 10 to the support structure 20 at at least a single point 15 through a horizontal line of block 10 or preferably at two points, as depicted on FIGS. 1 and 3, through a horizontal plane of mounting block 10, any movement will occur in the y direction which can be compensated for by said algorithm. By ensuring that the mounting block holding structure is substantially symmetrical, twisting due to temperature will be minimized. FIG. 2 depicts a drum type imaging device wherein a drum 22 is made to rotate at a predetermined velocity. Each laser contained within laser head 12a and 12b is made to pulse at predetermined intervals. As the mounting block holding structure 20, and laser heads are made to move along the drum's edges an image can be formed comprising a plurality of individual dots, each dot representing at least one laser pulse. The image is created upon a substrate placed upon said drum 22. As seen, it is preferable that each of the adjusting screws 16 be fully accessible, that is capable of adjustment, even though the mounting block 10 is engaged with the mounting block support structure 20. Accordingly a high precision mount enabling complete adjustability of at least one narrow bandwidth extreme precision device and the ability to stably retain the position of one narrow bandwidth extreme precision device to another would be an excellent improvement to the field of imaging, particularly for use in laser imaging devices in the graphic arts field.

The Applicant has provided only one possible embodiment of the device detailed above, which constitutes one preferred embodiment to the invention. It was described in detail to illustrate and describe one embodiment of the invention. As discussed, the Applicant is aware that numerous configurations are available, some of which have been referred to above, which would also provide the desired results. While the invention has been described and illustrated with reference to this specific embodiment, it is understood that the use of this embodiment or other embodiments, in this or other environments may be resorted to without departing from the invention. Therefore the form of the invention set out above should be considered illustrative and not as limiting the scope of the following claims.

What is claimed is:

1. A high precision mount comprising:
    a mounting block for holding, in substantially mirrored relation about an axis through a centerline of said mounting block two laser heads in stable relation to a substrate; and
    a means for adjusting within said mounting block said laser heads in each of an x, y, z, and θ direction.

2. A device according to claim 1, wherein said mounting block further comprises an upper cradling surface and a lower cradling surface each for receiving and supporting in intimate communication one of said laser heads respectively, and said mounting device further includes a thickness of material between each of said cradling surfaces thereby displacing each of said beam generating sources a minimum distance t from the other.

3. A device according to claim 2, wherein said cradling surfaces are aligned one to the other along a vertical plane through a centerline of each of said cradling surfaces.

4. A device according to claim 2, wherein said cradling surfaces are further angled toward each other with a forwardmost face of said mounting block measuring said minimum distance t and a rearmost face of said mounting block measuring some value greater than t.

5. A device according to claim 4, wherein said value of t is as small as practical and said some value greater than y is as small as practical limited by interference between said laser heads.

6. A device according to claim 2, wherein said mounting block is made from a material possessing a low coefficient of thermal expansion.

7. A device according to claim 2, wherein said means for adjusting said laser heads is capable of moving said beam generating source in the requisite direction in increments of no greater than about 1 micron.

8. A device according to claim 2, wherein said means for adjusting said laser heads comprise very fine threaded screws, wherein each of said very fine threaded screws is made to contact a portion of one of said laser heads at a contact point; whereby continuing to engage any one of said very fine threaded screw once said screw contacts said contact point causes said screw to displace said laser head a desired distance.

9. A device according to claim 8, wherein said adjustability in said y direction is dependent upon said adjustability in said x direction.

10. A device according to claim 9, wherein said very fine threaded screws have at least 80 threads per inch.

11. A device according to claim 3, for use in laser imaging wherein each of said laser heads is adjustable to the other in a smooth continuous movement.

12. A device according to claim 11, for use in laser imaging wherein each of said laser heads comprise a plurality of individual lasers spaced a fixed distance $r_h$ apart; whereby combining the adjustability of each of said laser heads with a predetermined time delay in pulsing each of said individual lasers enables a series of dots to be indicated upon said substrate, each dot representing at least one laser pulse.

13. A device according to claim 12, wherein said predetermined time delay is controlled by a computer.

14. A device according to claim 13, wherein said mounting block is made from a material possessing a low coefficient of thermal expansion.

15. A device according to claim 14, wherein said mounting block is made of invar.

16. A device according to claim 13, wherein a combination of said dots is a graphic image.

17. A high precision mount for retaining a plurality of laser heads in stable and adjustable relation for the opto-mechanical processing of a substrate comprising:
    a plurality of separately contained laser heads each having at least one laser emitting diode therein wherein at least one of said laser heads can be positionally adjusted and stably maintained with respect to at least another of said laser heads in at least an x, z, and θ direction;
    a substrate mounting surface for retaining a substrate which is to be subjected to an optical process,
    a mounting block for holding in stable relation said plurality of laser heads directionally toward said substrate mounting surface, said mounting block further comprising means for positionally adjusting and stably maintaining said laser heads one with respect to another; and
    a control means for controlling movement between said plurality of laser heads and said substrate mounting surface.

18. A device according to claim 17, wherein said mounting block further comprises a first cradling surface and a second cradling surface, wherein said second cradling surface is substantially identical to said first cradling surface and is mirrored about a center axis of said mounting block, and said cradling surface further support and retain a first and a second laser head respectively.

19. A device according to claim 18, wherein adjustability is accomplished by a plurality of adjustment means.

20. A device according to claim 19, wherein said adjustment means are fine threaded screws.

21. A device according to claim 20, wherein said mounting block is made from a material possessing a low coefficient of thermal expansion.

22. A device according to claim 21, wherein said mounting block is made of invar.

* * * * *